(12) United States Patent
Wang et al.

(10) Patent No.: US 11,776,621 B2
(45) Date of Patent: Oct. 3, 2023

(54) MEMORY DEVICE FOR INCREASING WRITE MARGIN DURING WRITE OPERATION AND REDUCING CURRENT LEAKAGE DURING STANDBY OPERATION AND OPERATION METHOD THEREOF

(71) Applicant: National Chung Cheng University, Chia-Yi (TW)

(72) Inventors: Jinn Shyan Wang, Chia-yi (TW); Chien Tung Liu, Yongjing Township (TW); Chih Jung Liu, Taichung (TW)

(73) Assignee: NATIONAL CHUNG CHENG UNIVERSITY, Chia-Yi (TW)

( * ) Notice: Subject to any disclaimer, the term of this patent is extended or adjusted under 35 U.S.C. 154(b) by 180 days.

(21) Appl. No.: 17/508,768

(22) Filed: Oct. 22, 2021

(65) Prior Publication Data

US 2023/0074722 A1 Mar. 9, 2023

(30) Foreign Application Priority Data

Sep. 6, 2021 (TW) .................................. 110133035

(51) Int. Cl.
*G11C 11/419* (2006.01)

(52) U.S. Cl.
CPC .................................. *G11C 11/419* (2013.01)

(58) Field of Classification Search
CPC ........... G11C 5/14; G11C 5/144; G11C 5/148; G11C 13/0038; G11C 16/30; G11C 2211/4067; G11C 2211/4068; G11C 2207/2227

USPC ........................................................ 365/154
See application file for complete search history.

(56) References Cited

U.S. PATENT DOCUMENTS

| | | | |
|---|---|---|---|
| 9,672,902 B1* | 6/2017 | Sinangil | G11C 11/419 |
| 10,943,647 B1* | 3/2021 | Fredeman | G11C 8/08 |
| 2016/0019945 A1* | 1/2016 | Sridhara | G11C 11/417 365/154 |
| 2018/0287592 A1* | 10/2018 | Cho | G11C 29/06 |
| 2020/0381042 A1* | 12/2020 | Pilo | G11C 7/12 |
| 2020/0402570 A1* | 12/2020 | Goel | G11C 11/417 |
| 2021/0090640 A1* | 3/2021 | Li | G11C 11/412 |
| 2021/0241803 A1* | 8/2021 | Jain | G11C 11/418 |

* cited by examiner

*Primary Examiner* — Sung Il Cho
(74) *Attorney, Agent, or Firm* — Muncy, Geissler, Olds & Lowe, P.C.

(57) ABSTRACT

A memory device and an operation method thereof is disclosed. The memory device includes a SRAM cell and a power supply assist circuit connected to the SRAM cell. The power supply assist circuit includes a first transistor, a second transistor, a third transistor, a fourth transistor, and a fifth transistor. The first transistor receives a power supply voltage. The control terminals of the first transistor and the second transistor are connected to each other. The third transistor switches, in response to a first control signal, to connect the control terminal and the connect terminal of the second transistor. The fourth transistor switches, in response to a second control signal, to drive the control terminal of the second transistor to a system ground voltage. The fifth transistor switches, in response to a third control signal, to drive the control terminal of the first transistor to the power supply voltage.

14 Claims, 3 Drawing Sheets

MEMORY DEVICE FOR INCREASING WRITE MARGIN DURING WRITE OPERATION AND REDUCING CURRENT LEAKAGE DURING STANDBY OPERATION AND OPERATION METHOD THEREOF

This application claims priority of Application No. 110133035 filed in Taiwan on Sep. 6, 2021, under 35 U.S.C. § 119; the entire contents of all of which are hereby incorporated by reference.

BACKGROUND OF THE INVENTION

Field of the Invention

The present invention relates to a memory device, particularly to a memory device and an operation method thereof.

Description of the Related Art

Design of static random access memory (SRAM) devices should provide good read stability and write margins and provide low power consumption no matter in a read, write, standby, or shut-down mode.

As the technology advances, however, designing such margins and achieving low power has been increasingly challenging due at least in part to the scaling down of the minimum feature sizes of the transistors. The speed gain of the transistors through feature-size scaling, although desirable, has increased leakage current. In a memory device comprising multiple SRAM banks, with each bank comprising multiple SRAM cells, the leakage current may be too high to cause an unacceptable level of power consumption and even functional failures. Unfortunately, measures taken to minimize the current leakage may negatively impact the write-ability of the SRAM cells. Various methods that attempted to overcome the previous write-margin issues may be inadequate for optimizing the SRAM design. For example, some design methods used boosted word-line voltage, but this may increase power consumption. Some designs applied the technique of negative bit-line, but this may induce an increase in power consumption and a high area overhead. Some others used the methods of lowering cell-VDD (VDDL) or transient VDD collapse (TVC). The strong-bias VDDL potentially consumes more static power, and the TVC requires careful pulse-width control for the pulsed pull-down device. On the other hand, one cannot directly apply the techniques mentioned above in standby and shut-down operations because of either a high overhead on power consumption or a problematic design requirement on transient behavior.

To overcome the abovementioned problems, the present invention provides a memory device and an operation method.

SUMMARY OF THE INVENTION

The present invention provides a memory device and an operation method thereof, which generate a power supply voltage that can increase the write margin during a write operation or reduce current leakage during a standby operation. Driving the local power supply voltage node to a floating state may remove current leakage during a shut-down mode. When generating a power supply voltage to drive the local power supply voltage node, the power supply assist circuit can get a stable voltage without consuming static power. Therefore, an SRAM cell being un-accessed not only during a read or a write operation for other accessed cells but also during a sleep operation for all SRAM cells may be in the standby operation.

In an embodiment of the present invention, a memory device includes a static random access memory (SRAM) cell and a power supply assist circuit. The SRAM cell includes a memory transistor and a power supply voltage node. The memory transistor is configured to receive a first power supply voltage, wherein the first power supply voltage is substantially equal to a system power supply voltage. The power supply voltage node is configured to receive a second power supply voltage or not receive power supply voltage, wherein the second power supply voltage is substantially equal to or less than the first power supply voltage. The power supply assist circuit includes a first transistor, a second transistor, a third transistor, a fourth transistor, and a fifth transistor. The first transistor is connected to an internal voltage node and configured to receive the first power supply voltage. The second transistor is connected to the power supply voltage node of the SRAM cell and the internal voltage node and configured to receive an internal power supply voltage from the internal voltage node, wherein the control terminals of the first transistor and the second transistor are connected together. The third transistor is configured to switch, in response to a first control signal, to connect the control terminal of the second transistor and the connect terminal of the second transistor connected to the power supply voltage node. The fourth transistor is configured to switch, in response to a second control signal, to drive the control terminal of the second transistor to a system ground voltage. The fifth transistor is configured to switch, in response to a third control signal, to drive the control terminal of the first transistor to the first power supply voltage.

In an embodiment of the present invention, the power supply assist circuit is configured to provide the first power supply voltage, without consuming static power, to the power supply voltage node of the SRAM cell being in a read mode in response to the power supply assist circuit receiving the first control signal, the second control signal, and the third control signal.

In an embodiment of the present invention, the power supply assist circuit is configured to provide the second power supply voltage, without consuming static power, to the power supply voltage node of the SRAM cell being in a write or standby mode in response to the power supply assist circuit receiving the first control signal, the second control signal, and the third control signal.

In an embodiment of the present invention, the power supply assist circuit is configured to cut off a power supply voltage, without consuming static power, to the power supply voltage node of the SRAM cell being in a shut-down mode in response to the power supply assist circuit receiving the first control signal, the second control signal, and the third control signal.

In an embodiment of the present invention, the SRAM cell is disposed on an integrated circuit chip and the power supply assist circuit is disposed externally to the integrated circuit chip.

In an embodiment of the present invention, the memory transistor is a metal-oxide-semiconductor field effect transistor, the body of the metal-oxide-semiconductor field effect transistor is configured to receive the first power supply voltage, and the source of the metal-oxide-semiconductor field effect transistor is configured to receive the second power supply voltage.

In an embodiment of the present invention, a memory device includes a memory array and one or more power supply assist circuits. Each of the SRAM cells includes a memory transistor and a power supply voltage node. The memory transistor is configured to receive a first power supply voltage, wherein the first power supply voltage is substantially equal to a system power supply voltage. The power supply voltage node is configured to receives a second power supply voltage or not receive a power supply voltage, wherein the second power supply voltage is substantially equal to or less than the first power supply voltage. The power supply assist circuit includes a first transistor, a second transistor, a third transistor, a fourth transistor, and a fifth transistor. The first transistor is connected to an internal voltage node and configured to receive the first power supply voltage. The second transistor is connected to the power supply voltage node of the SRAM cell and the internal voltage node and configured to receive an internal power supply voltage from the internal voltage node, wherein the control terminals of the first transistor and the second transistor are connected together. The third transistor is configured to switch, in response to a first control signal, to connect the control terminal of the second transistor and a connect terminal of the second transistor connected to the power supply voltage node. The fourth transistor is configured to switch, in response to a second control signal, to drive the control terminal of the second transistor to a system ground voltage. The fifth transistor is configured to switch, in response to a third control signal, to drive the control terminal of the first transistor to the first power supply voltage.

In an embodiment of the present invention, the power supply assist circuit is configured to provide the first power supply voltage, without consuming static power, to the power supply voltage node of the SRAM cell being in a read mode in response to the power supply assist circuit receiving the first control signal, the second control signal, and the third control signal.

In an embodiment of the present invention, the power supply assist circuit is configured to provide the second power supply voltage, without consuming static power, to the power supply voltage node of the SRAM cell being in a write or standby mode in response to the power supply assist circuit receiving the first control signal, the second control signal, and the third control signal.

In an embodiment of the present invention, the power supply assist circuit is configured to cut off a power supply voltage, without consuming static power, to the power supply voltage node of the SRAM cell being in a shut-down mode in response to the power supply assist circuit receiving the first control signal, the second control signal, and the third control signal.

In an embodiment of the present invention, the SRAM cell is disposed on an integrated circuit chip and the power supply assist circuit is disposed externally to the integrated circuit chip.

In an embodiment of the present invention, the memory transistor is a metal-oxide-semiconductor field effect transistor, the body of the metal-oxide-semiconductor field effect transistor is configured to receive the first power supply voltage, and the source of the metal-oxide-semiconductor field effect transistor is configured to receive the second power supply voltage.

In an embodiment of the present invention, an operation method is applied to the memory device, wherein the SRAM cells include a first static random access memory cell and a second static random access memory cell, and the operation method includes: the first static random access memory cell receiving the first power supply voltage; and the power supply assist circuit receiving the first control signal, the second control signal, and the third control signal; wherein the power supply assist circuit provides the first power supply voltage to the power supply voltage node of the first static random access memory cell being in a read mode in response to the power supply assist circuit receiving the first control signal, the second control signal, and the third control signal; wherein the power supply assist circuit provides the second power supply voltage to the power supply voltage node of the first static random access memory cell being in a write mode in response to the power supply assist circuit receiving the first control signal, the second control signal, and the third control signal; wherein the power supply assist circuit provides the second power supply voltage to the power supply voltage node of the first static random access memory cell being in a standby mode in response to the power supply assist circuit receiving the first control signal, the second control signal, and the third control signal; wherein the power supply assist circuit cuts off a power supply voltage to the power supply voltage node of the first static random access memory cell being in a shut-down mode in response to the power supply assist circuit receiving the first control signal, the second control signal, and the third control signal.

In an embodiment of the present invention, the operation method further includes a step of the second static random access memory cell receiving the first power supply voltage, wherein the power supply assist circuit provides the first power supply voltage to the power supply voltage node of the second static random access memory cell being in a read mode in response to the power supply assist circuit receiving the first control signal, the second control signal, and the third control signal; the power supply assist circuit provides the second power supply voltage to the power supply voltage node of the second static random access memory cell being in a write mode in response to the power supply assist circuit receiving the first control signal, the second control signal, and the third control signal; the power supply assist circuit provides the second power supply voltage to the power supply voltage node of the second static random access memory cell being in a standby mode in response to the power supply assist circuit receiving the first control signal, the second control signal, and the third control signal; the power supply assist circuit cuts off a power supply voltage to the power supply voltage node of the second static random access memory cell being in a shut-down mode in response to the power supply assist circuit receiving the first control signal, the second control signal, and the third control signal.

To sum up, the power supply assist circuit of the memory device drives the local power supply voltage node to a generated a power supply voltage or a floating state. The generated power supply voltage can increase the write margin during a write operation or reduce current leakage during a standby operation. Driving the local power supply voltage node to a floating state may remove current leakage during a shut-down mode. When generating a power supply voltage to drive the local power supply voltage node, the power supply assist circuit can get a stable voltage without consuming static power. Therefore, an SRAM cell being un-accessed not only during a read or a write operation for other accessed cells but also during a sleep operation for all SRAM cells may be in the standby operation.

Below, the embodiments are described in detail in cooperation with the drawings to make easily understood the technical contents, characteristics and accomplishments of the present invention.

DETAILED DESCRIPTION OF THE INVENTION

Figure 1:
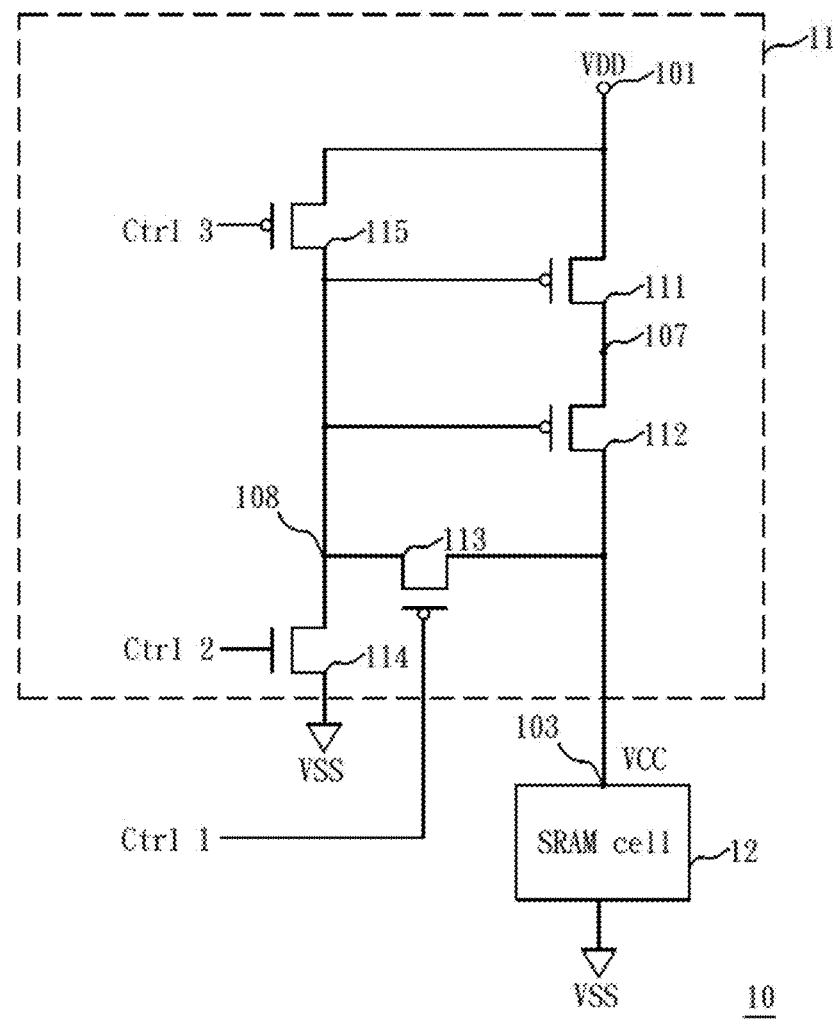
FIG. 1 is a diagram schematically illustrating a memory device according to a first embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous. The phrase "A/B" means A or B. For the purposes of the present invention, the phrase "A and/or B" means "(A), (B), or (A and B)". For the purposes of the present invention, the phrase "at least one of A, B, and C" means "(A), (B), (C), (A and B), (A and C), (B and C), or (A, B and C)". For the purposes of the present invention, the phrase "(A)B" means "(B) or (AB)", that is, A is an optional element.

The terms chip, die, integrated circuit, monolithic device, semiconductor device, and microelectronic device are often used interchangeably in the microelectronics field. The present invention is applicable to all of the above as they are generally understood in the field.

Embodiments of the present invention are directed to methods and apparatuses for low-power write- and standby-assist voltage generation for SRAM devices and integrated power gating for shutting down SRAM devices. According to various embodiments, one or more SRAM cells may include a local power supply voltage node and a voltage generation means, such as a power-supply assist circuit, for driving the local power supply voltage node to a generated power supply voltage or a floating state. For various embodiments, the generated power supply voltage may increase the write margin during a write operation or reduce current leakage during a standby operation. Driving the local power supply voltage node to a floating state may remove current leakage during a shut-down mode. According to various embodiments, when generating a power supply voltage to drive the local power supply voltage node, the power-supply assist circuit can get a stable voltage without consuming static power. Therefore, for various embodiments, an SRAM cell being un-accessed not only during a read or a write operation for other accessed cells but also during a sleep operation for all SRAM cells may be in the standby operation.

Figure 2:
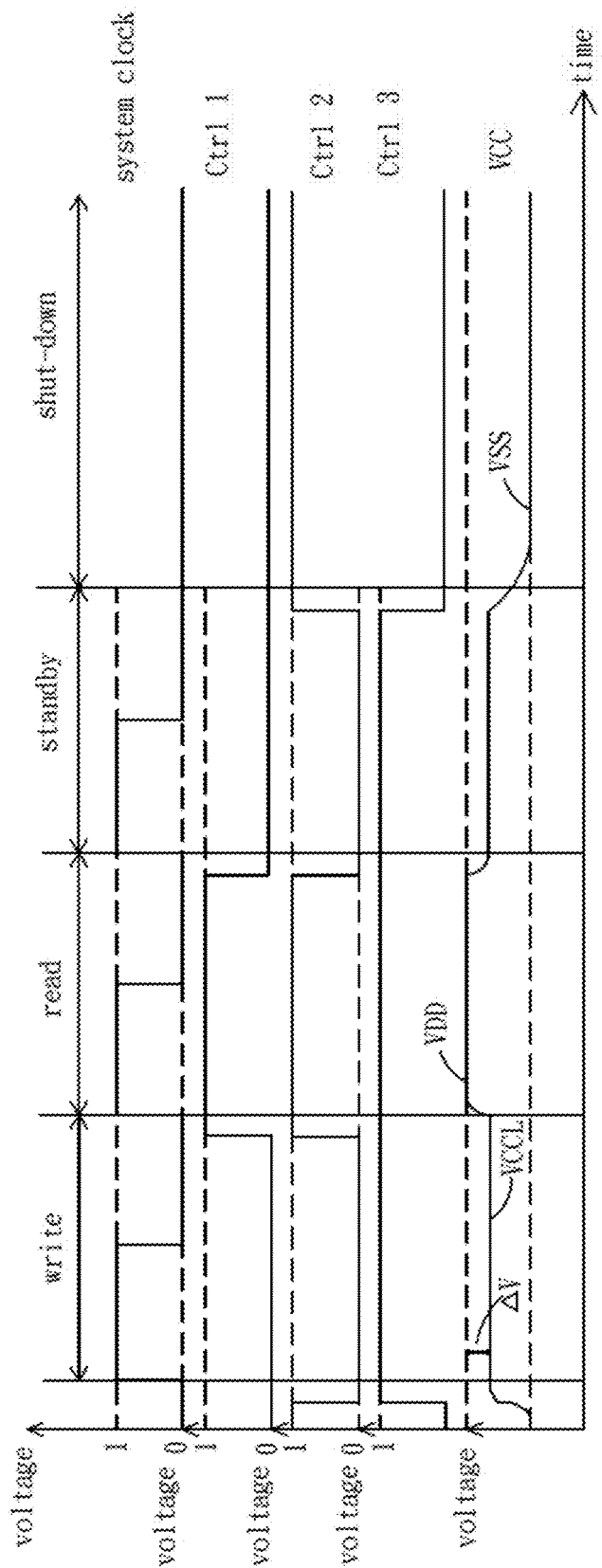
FIG. 2 is a diagram schematically illustrating the voltage waveforms of a system clock, a first control signal, a second control signal, a third control signal, a and a power supply voltage node according to a second embodiment of the present invention.

FIG. 1 is a diagram schematically illustrating a memory device according to a first embodiment of the present invention. FIG. 2 is a diagram schematically illustrating the voltage waveforms of a system clock, a first control signal, a second control signal, a third control signal, a and a power supply voltage node according to a second embodiment of the present invention. The memory device may be synchronous or asynchronous, depending on the application; that is, the memory device may be synchronous or asynchronous to the system clock (refer, e.g., to the system clock of FIG. 2).

As illustrated in FIG. 1, a memory device 10 includes a power supply assist circuit 11 and a static random access memory (SRAM) cell 12. The SRAM cell 12 may be disposed on an integrated circuit chip. The power supply assist circuit 11 is disposed externally to the integrated circuit chip. The SRAM cell 12 may be a conventionally-known differential 6T SRAM cell (abbreviated herein as 6T cell) or a dual-split-control (DSC) 6T cell (abbreviated herein as DSC-6T cell) described in U.S. application Ser. No. 17/073,672, and thus, will not be explained in detail herein except where such explanation aids in understanding the present invention. The SRAM cell 12 includes a memory transistor and a power supply voltage node 103. The memory transistor is configured to receive a first power supply voltage, wherein the first power supply voltage is substantially equal to a system power supply voltage. The memory transistor is a metal-oxide-semiconductor field effect transistor. The body of the metal-oxide-semiconductor field effect transistor is configured to receive the first power supply voltage VDD. The source of the metal-oxide-semiconductor field effect transistor is configured to receive the second power supply voltage VCC. The power supply voltage node is configured to receive a second power supply voltage VCC or not receive a power supply voltage, wherein the second power supply voltage VCC is substantially equal to or less than the first power supply voltage VDD. According to various embodiments, one may configure SRAM cell 12 to receive a first power supply voltage VDD (sometimes referred to herein as "global power supply voltage"). According to various embodiments, one may configure the power supply assist circuit 11 to drive a local power supply voltage node 103 to a second power supply voltage VCC. First power supply voltage VDD may be any positive supply voltage suitable for the application but generally excludes negative or ground voltages VSS, as will become more evident by the discussion herein. The second power supply voltage VCC provided to local power supply voltage node 103 may depend at least in part on the status of SRAM cell 12. For example, SRAM cell 12 may at times be in a read mode, a write mode, a standby mode, or a shut-down mode. The standby mode may generally refer to a lower-power data retention mode. For various embodiments, an SRAM cell being un-accessed not only during a read or a write operation for other accessed cells but also during a sleep operation for all SRAM cells may be in the standby mode. In the shut-down process of an SRAM cell, the power supplied to the SRAM cell is wholly cut off, meaning that the SRAM cell does not retain the data.

The power supply assist circuit 11 includes a first transistor 111, a second transistor 112, a third transistor 113, a fourth transistor 114, and a fifth transistor 115. The first transistor 111, the second transistor 112, the third transistor 113, and the fifth transistor 115 are exemplified by P-channel metal-oxide-semiconductor field effect transistors. The fourth transistor 114 is exemplified by an N-channel metal-oxide-semiconductor field effect transistor. The first transistor 111, connected to an internal voltage node 107, receives the first power supply voltage VDD. The second transistor 112, connected to the power supply voltage node 103 of the SRAM cell 12 and the internal voltage node 107, receives an internal power supply voltage from the internal voltage node 107. The control terminals as gates of the first transistor 111 and the second transistor 112 are connected together. The third transistor 113 switches, in response to a first control signal Ctrl 1, to connect the control terminal of the second transistor 112 and the connect terminal of the second transistor 112 connected to the power supply voltage node 103. The fourth transistor 114 switches, in response to a second control signal Ctrl 2, to drive the control terminal of the second transistor 112 to a system ground voltage VSS. The fifth transistor 115 switches, in response to a third control signal Ctrl 3, to drive the control terminal of the first transistor 111 to the first power supply voltage VDD.

During the read mode, the control signals Ctrl1, Ctrl2, and Ctrl3 are all at a logic-1 value to turn on the fourth transistor 114 and turn off the transistors 113 and 115. In this case, node 108 is pulled down to the system ground voltage VSS to turn on transistors 111 and 112. The second power supply voltage VCC provided to local power supply voltage node 103 by power supply assist circuit 11 may be some voltage substantially equal to the first power supply voltage VDD.

During the write mode, there may be some data to be written to SRAM cell 12. Control signals Ctrl1 and Ctrl2 are assigned a logic-0 value, and control signal Ctrl3 is a logic-1 value. The fourth transistor 114 and the fifth transistor 115 are turned off, and the third transistor 113 is turned on. Now, the second transistor 112 has an equivalent short effect between nodes 103 and 108 and behaves as a diode in this configuration. This configuration results in the second power-supply voltage VCC at node 103 being less than the first power supply voltage VDD at terminal 101 by one diode voltage drop $\Delta V$. Only pulsed current will flow through transistors 111 and 112 at the beginning of the write operation. The local power supply voltage node 103 is finally driven to a stable voltage 'VDD-$\Delta V$≡VCCL' without consuming static power. By reducing the second power supply voltage VCCL relative to the first power supply voltage VDD, one can increase the write margin. Note that the circuit feeds back VCC to control the first transistor 111. The effect of the feedback control leads to a stable value of $\Delta V$, which is resilient to process, VDD, and temperature (PVT) variations.

For various embodiments, power supply assist circuit 11 may be configured to minimize current leakage of SRAM cell 12 during a standby mode, reducing total power consumption of SRAM cell 12. The standby mode may be prompted by control signals Ctrl1, Ctrl2, and Ctrl3 as with the write mode. According to various embodiments and regarding both FIG. 1 and FIG. 2, during the standby mode, the second power supply voltage provided to local power supply voltage node 103 by power supply assist circuit 11 may be some voltage $\Delta V$ less than the first power supply voltage VDD. For various embodiments, with the second power supply voltage being a voltage $\Delta V$ less than the first power supply voltage VDD, source to body junctions of at least two PMOS load transistors in an SRAM cell 12 may be reverse biased due to the source voltage being lower than the body voltage of these PMOS transistors.

In the shut-down process of an SRAM cell 12, the power supplied to the SRAM cell 12 is wholly cut off, meaning that the SRAM cell 12 does not retain the data. During the shut-down mode, control signals Ctrl1 and Ctrl3 are at a logic-0 value, and control signal Ctrl2 is at a logic-1 value. Therefore, the fourth transistor 114 and the third transistor 113 are turned off, and the fifth transistor 115 is turned on. In this case, node 108 is pulled high to VDD to turn off transistors 111 and 112 so that the current paths from voltage terminal 101 to power supply voltage node 103 are completely cut off, and the local power supply voltage node 103 becomes floating. In the long run, such a power-gating effect will result in charge loss at node 103 by the current leakage through the SRAM cell 12, and VCC becomes equal to the system ground voltage VSS.

Table 1 shows the logic values, voltages, or states of the first control signal Ctrl 1, the second control signal Ctrl 2, the third control signal Ctrl 3, and the second power supply voltage VCC.

TABLE 1

| Operation | Read | Write | Standby | Shut-down |
|---|---|---|---|---|
| Ctrl 1 | 1 | 0 | 0 | 1 |
| Ctrl 2 | 1 | 0 | 0 | 0 |
| Ctrl 3 | 1 | 1 | 1 | 0 |
| VCC | VDD | VDD-$\Delta V$ | VDD-$\Delta V$ | floating |

Figure 3:
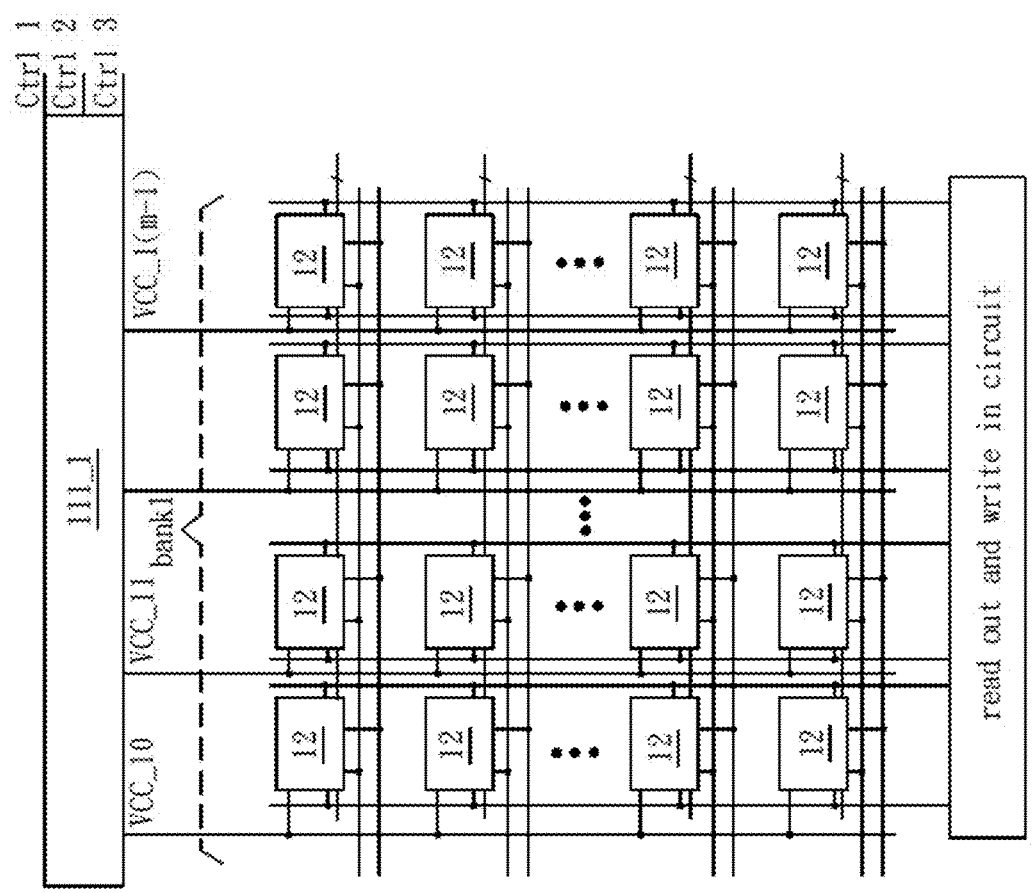
FIG. 3 is a diagram schematically illustrating a memory device according to a second embodiment of the present invention.
Figure 3:
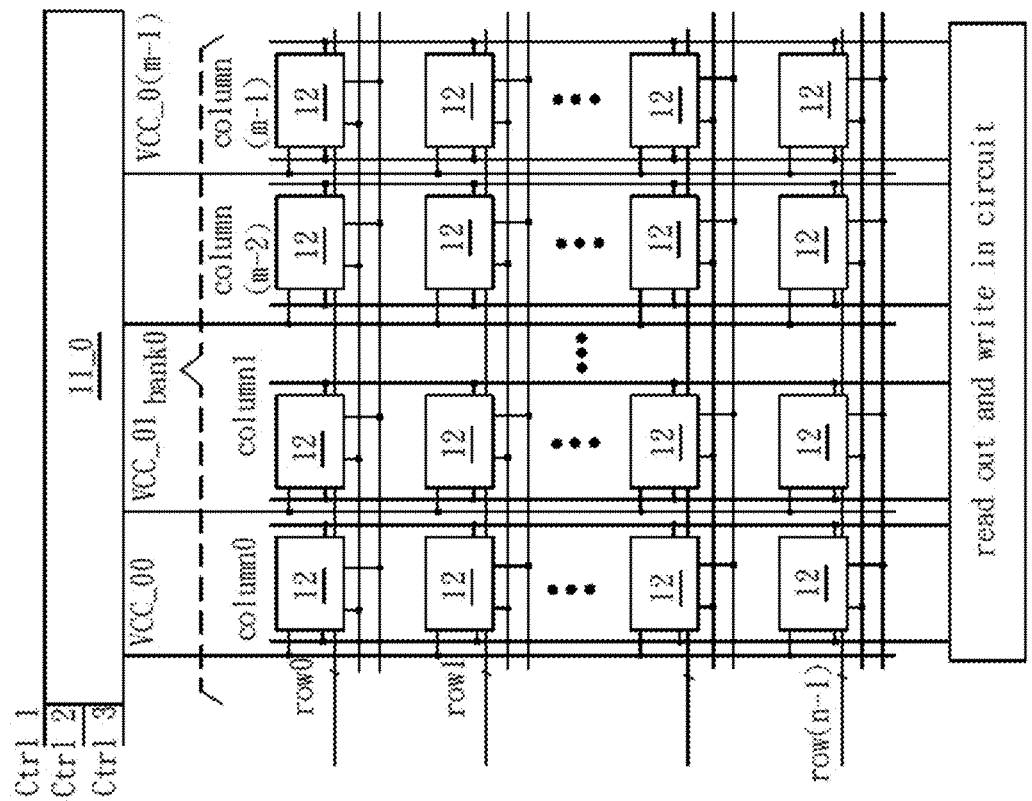

FIG. 1 generally depicts a single power supply assist circuit 11, configured to drive the local supply voltage node 10 of one SRAM cell 12 to a selected voltage. Power supply assist circuit 11 may, in various embodiments, be configured to drive the local power supply voltage node 103 of two or more SRAM cells 12 to a selected voltage. In various embodiments, an SRAM device may include two or more power supply assist circuits to separately drive the local supply voltage nodes of different SRAM banks to different selected voltage. As illustrated in FIG. 2 and FIG. 3, a memory device may include two power supply assist circuits 11_0 and 11_1 and two banks of SRAM cells 12. As in conventional SRAM arrays, each bank of SRAM cells 12 may include columns of column 0 through column (n−1) and rows of row 0 through row (m−1).

As discussed more fully herein, during a read mode, e.g., bank 0 prompted by Ctrl1, Ctrl2, and Ctrl3 for bank 0, some data in one or more SRAM cells 12 in bank 0, may need to be read out through bit-lines of SRAM cells 12. In this example, all the local power supply voltages of bank 0, VCC_00, VCC_01, . . . , and VCC_0(m−1) may be some voltage substantially equal to the first power supply voltage VDD. While bank 0 is in a read mode, bank 1 may be in a standby mode, and all the local supply voltage voltages of bank 1 may be some voltage ΔV less than the first power supply voltage VDD. During a write mode, e.g., for bank 0 prompted by Ctrl1, Ctrl2, and Ctrl3, some data may need to be written to one or more SRAM cells 12. In this example, all the local supply voltage voltages of bank 0, VCC_00, VCC_01, . . . , and VCC_0(m−1) may be some voltage ΔV less than the first power supply voltage VDD. While bank 0 is in a write mode, bank 1 may be in a standby mode, and all the local supply voltage voltages of bank 1 may also be some voltage ΔV less than the first power supply voltage VDD. Both banks 0 and 1 may stay in a standby mode. In such an operation mode, all the local supply voltage voltages of bank 0 and bank 1 may be some voltage ΔV less than the first power supply voltage VDD. During a shut-down mode, all the SRAM cells 12 in banks 0 and 1 will not retain data, and all the local power supply voltage nodes 103 in both banks become floating. In the long run, the power-gating effect will result in charge loss at nodes 103 by the current leakage through the SRAM cell 12, and all local power supply voltages become equal to the system ground voltage VSS.

According to various embodiments, power supply assist circuit 11 may advantageously be disposed externally to SRAM cell 12, being not to increase the chip area at the memory cell level. Referring to FIG. 3, power supply assist circuit 11 may be integral to the SRAM cell array or may instead be external to it, depending on the application. Accordingly, this design may avoid an increase in the size of the SRAM cell array to the extent desired for the application.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A memory device comprising:
a static random access memory (SRAM) cell including:
a memory transistor configured to receive a first power supply voltage, wherein the first power supply voltage is substantially equal to a system power supply voltage; and
a power supply voltage node for receiving a second power supply voltage or for not receiving a power supply voltage, wherein the second power supply voltage is substantially equal to or less than the first power supply voltage; and
a power supply assist circuit including:
a first transistor connected to an internal voltage node and configured to receive the first power supply voltage;
a second transistor connected to the power supply voltage node of the SRAM cell and the internal voltage node and configured to receive an internal power supply voltage from the internal voltage node, wherein control terminals of the first transistor and the second transistor are connected together;
a third transistor configured to switch, in response to a first control signal, to connect the control terminal of the second transistor and a connect terminal of the second transistor connected to the power supply voltage node;
a fourth transistor configured to switch, in response to a second control signal, to drive the control terminal of the second transistor to a system ground voltage; and
a fifth transistor configured to switch, in response to a third control signal, to drive the control terminal of the first transistor to the first power supply voltage.

2. The memory device of claim 1, wherein the power supply assist circuit is configured to provide the first power supply voltage, without consuming static power, to the power supply voltage node of the SRAM cell being in a read mode in response to the power supply assist circuit receiving the first control signal, the second control signal, and the third control signal.

3. The memory device of claim 1, wherein the power supply assist circuit is configured to provide the second power supply voltage, without consuming static power, to the power supply voltage node of the SRAM cell being in a write or standby mode in response to the power supply assist circuit receiving the first control signal, the second control signal, and the third control signal.

4. The memory device of claim 1, wherein the power supply assist circuit is configured to cut off a power supply voltage, without consuming static power, to the power supply voltage node of the SRAM cell being in a shut-down mode in response to the power supply assist circuit receiving the first control signal, the second control signal, and the third control signal.

5. The memory device of claim 1, wherein the SRAM cell is disposed on an integrated circuit chip and the power supply assist circuit is disposed externally to the integrated circuit chip.

6. The memory device of claim 1, wherein the memory transistor is a metal-oxide-semiconductor field effect transistor, a body of the metal-oxide-semiconductor field effect transistor is configured to receive the first power supply voltage, and a source of the metal-oxide-semiconductor field effect transistor is configured to receive the second power supply voltage.

7. A memory device comprising:
a memory array comprising static random access memory (SRAM) cells, wherein each of the SRAM cells includes:
a memory transistor configured to receive a first power supply voltage, wherein the first power supply voltage is substantially equal to a system power supply voltage; and
a power supply voltage node for receiving a second power supply voltage or for not receiving a power supply voltage, wherein the second power supply voltage is substantially equal to or less than the first power supply voltage; and one or more power supply assist circuits, wherein the power supply assist circuit includes:
- a first transistor connected to an internal voltage node and configured to receive the first power supply voltage;
- a second transistor connected to the power supply voltage node of the SRAM cell and the internal voltage node and configured to receive an internal power supply voltage from the internal voltage node, wherein control terminals of the first transistor and the second transistor are connected together;
- a third transistor configured to switch, in response to a first control signal, to connect the control terminal of the second transistor and a connect terminal of the second transistor connected to the power supply voltage node;
- a fourth transistor configured to switch, in response to a second control signal, to drive the control terminal of the second transistor to a system ground voltage; and
- a fifth transistor configured to switch, in response to a third control signal, to drive the control terminal of the first transistor to the first power supply voltage.

8. The memory device of claim 7, wherein the power supply assist circuit is configured to provide the first power supply voltage, without consuming static power, to the power supply voltage node of the SRAM cell being in a read mode in response to the power supply assist circuit receiving the first control signal, the second control signal, and the third control signal.

9. The memory device of claim 7, wherein the power supply assist circuit is configured to provide the second power supply voltage, without consuming static power, to the power supply voltage node of the SRAM cell being in a write or standby mode in response to the power supply assist circuit receiving the first control signal, the second control signal, and the third control signal.

10. The memory device of claim 7, wherein the power supply assist circuit is configured to cut off a power supply voltage, without consuming static power, to the power supply voltage node of the SRAM cell being in a shut-down mode in response to the power supply assist circuit receiving the first control signal, the second control signal, and the third control signal.

11. The memory device of claim 7, wherein the SRAM cell is disposed on an integrated circuit chip and the power supply assist circuit is disposed externally to the integrated circuit chip.

12. The memory device of claim 7, wherein the memory transistor is a metal-oxide-semiconductor field effect transistor, a body of the metal-oxide-semiconductor field effect transistor is configured to receive the first power supply voltage, and a source of the metal-oxide-semiconductor field effect transistor is configured to receive the second power supply voltage.

13. An operation method applied to the memory device of claim 7, wherein the SRAM cells comprise a first static random access memory cell and a second static random access memory cell, and the operation method comprising:
- the first static random access memory cell receiving the first power supply voltage; and
- the power supply assist circuit receiving the first control signal, the second control signal, and the third control signal;
- wherein the power supply assist circuit provides the first power supply voltage to the power supply voltage node of the first static random access memory cell being in a read mode in response to the power supply assist circuit receiving the first control signal, the second control signal, and the third control signal;
- wherein the power supply assist circuit provides the second power supply voltage to the power supply voltage node of the first static random access memory cell being in a write mode in response to the power supply assist circuit receiving the first control signal, the second control signal, and the third control signal;
- wherein the power supply assist circuit provides the second power supply voltage to the power supply voltage node of the first static random access memory cell being in a standby mode in response to the power supply assist circuit receiving the first control signal, the second control signal, and the third control signal;
- wherein the power supply assist circuit cuts off a power supply voltage to the power supply voltage node of the first static random access memory cell being in a shut-down mode in response to the power supply assist circuit receiving the first control signal, the second control signal, and the third control signal.

14. The operation method of claim 13, further comprising a step of the second static random access memory cell receiving the first power supply voltage, wherein the power supply assist circuit provides the first power supply voltage to the power supply voltage node of the second static random access memory cell being in a read mode in response to the power supply assist circuit receiving the first control signal, the second control signal, and the third control signal; the power supply assist circuit provides the second power supply voltage to the power supply voltage node of the second static random access memory cell being in a write mode in response to the power supply assist circuit receiving the first control signal, the second control signal, and the third control signal; the power supply assist circuit provides the second power supply voltage to the power supply voltage node of the second static random access memory cell being in a standby mode in response to the power supply assist circuit receiving the first control signal, the second control signal, and the third control signal; the power supply assist circuit cuts off a power supply voltage to the power supply voltage node of the second static random access memory cell being in a shut-down mode in response to the power supply assist circuit receiving the first control signal, the second control signal, and the third control signal.

* * * * *